(12) United States Patent
Soper et al.

(10) Patent No.: US 6,785,878 B2
(45) Date of Patent: Aug. 31, 2004

(54) CORRECTING A MASK PATTERN USING MULTIPLE CORRECTION GRIDS

(75) Inventors: Robert A. Soper, Plano, TX (US); Carl A. Vickery, III, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 59 days.

(21) Appl. No.: 10/210,413

(22) Filed: Jul. 31, 2002

(65) Prior Publication Data

US 2004/0023127 A1 Feb. 5, 2004

(51) Int. Cl.[7] ............................................. G06F 17/50
(52) U.S. Cl. ........................................ 716/19; 716/21
(58) Field of Search .......................... 716/19–21; 430/5

(56) References Cited

U.S. PATENT DOCUMENTS

| | | | | |
|---|---|---|---|---|
| 5,124,927 A | * | 6/1992 | Hopewell et al. | ........... 700/121 |
| 5,539,446 A | * | 7/1996 | Sullivan | ..................... 347/262 |
| 6,114,071 A | * | 9/2000 | Chen et al. | ..................... 430/5 |
| 6,303,253 B1 | * | 10/2001 | Lu | ............................... 716/19 |
| 6,470,489 B1 | * | 10/2002 | Chang et al. | ................. 716/21 |
| 6,553,559 B2 | * | 4/2003 | Liebmann et al. | ............ 716/19 |
| 6,625,802 B2 | * | 9/2003 | Singh et al. | .................. 716/21 |
| 2004/0015794 A1 | * | 1/2004 | Kotani et al. | .................. 716/4 |

* cited by examiner

Primary Examiner—Leigh M. Garbowski
Assistant Examiner—Paul Dinh
(74) Attorney, Agent, or Firm—Peter K. McLarty; W. James Brady, III; Frederick J. Telecky, Jr.

(57) ABSTRACT

Correcting a mask pattern includes accessing a record associated with an uncorrected pattern that comprises segments. The record associates each segment with a correction grid of a number of correction grids, where each correction grid comprises points. A segment is selected, and an optimal correction for the segment is determined. A correction grid associated with the segment is determined. The segment is snapped to a subset of points of the associated correction grid, where the subset of points is proximate to the optimal correction, to form a corrected pattern of a mask pattern.

20 Claims, 3 Drawing Sheets

CORRECTING A MASK PATTERN USING MULTIPLE CORRECTION GRIDS

TECHNICAL FIELD OF THE INVENTION

This invention relates generally to the field of integrated circuits and more specifically to correcting a mask pattern using multiple correction grids.

BACKGROUND OF THE INVENTION

Masks such as photomasks are typically used in photolithographic systems to define patterns on objects such as integrated circuits. The shape of the mask, however, may sometimes differ from the pattern defined on the object. For example, optical diffraction may cause a resulting pattern defined on an integrated circuit to differ from the shape of the mask. Consequently, masks are typically adjusted to account for these deviations.

SUMMARY OF THE INVENTION

In accordance with the present invention, a method and system for correcting a mask pattern are provided that substantially reduce or eliminate disadvantages and problems associated with previously developed systems and methods.

According to one embodiment of the present invention, correcting a mask pattern includes accessing a record associated with an uncorrected pattern that comprises segments. The record associates each segment with a correction grid of a number of correction grids, where each correction grid comprises points. A segment is selected, and an optimal correction for the segment is determined. A correction grid associated with the segment is determined. The segment is snapped to a subset of points of the associated correction grid, where the subset of points is proximate to the optimal correction, to form a corrected pattern of a mask pattern.

Certain embodiments of the invention may provide one or more technical advantages. A technical advantage of one embodiment may be that multiple correction grids are used to correct a mask pattern. A fine grid is used to correct segments that require more precise correction, while a coarse grid is used to correct segments that require less precise correction. The multiple grids may allow for increasing efficiency of the mask correction while maintaining required correction precision.

Certain embodiments of the invention may include none, some, or all of the above technical advantages. One or more other technical advantages may be readily apparent to one skilled in the art from the figures, descriptions, and claims included herein.

BRIEF DESCRIPTION OF THE DRAWINGS

For a more complete understanding of the present invention and for further features and advantages, reference is now made to the following description, taken in conjunction with the accompanying drawings, in which.

DETAILED DESCRIPTION OF THE DRAWINGS

Embodiments of the present invention and its advantages are best understood by referring to FIGS. 1 through 5 of the drawings, like numerals being used for like and corresponding parts of the various drawings.

Figure 1:
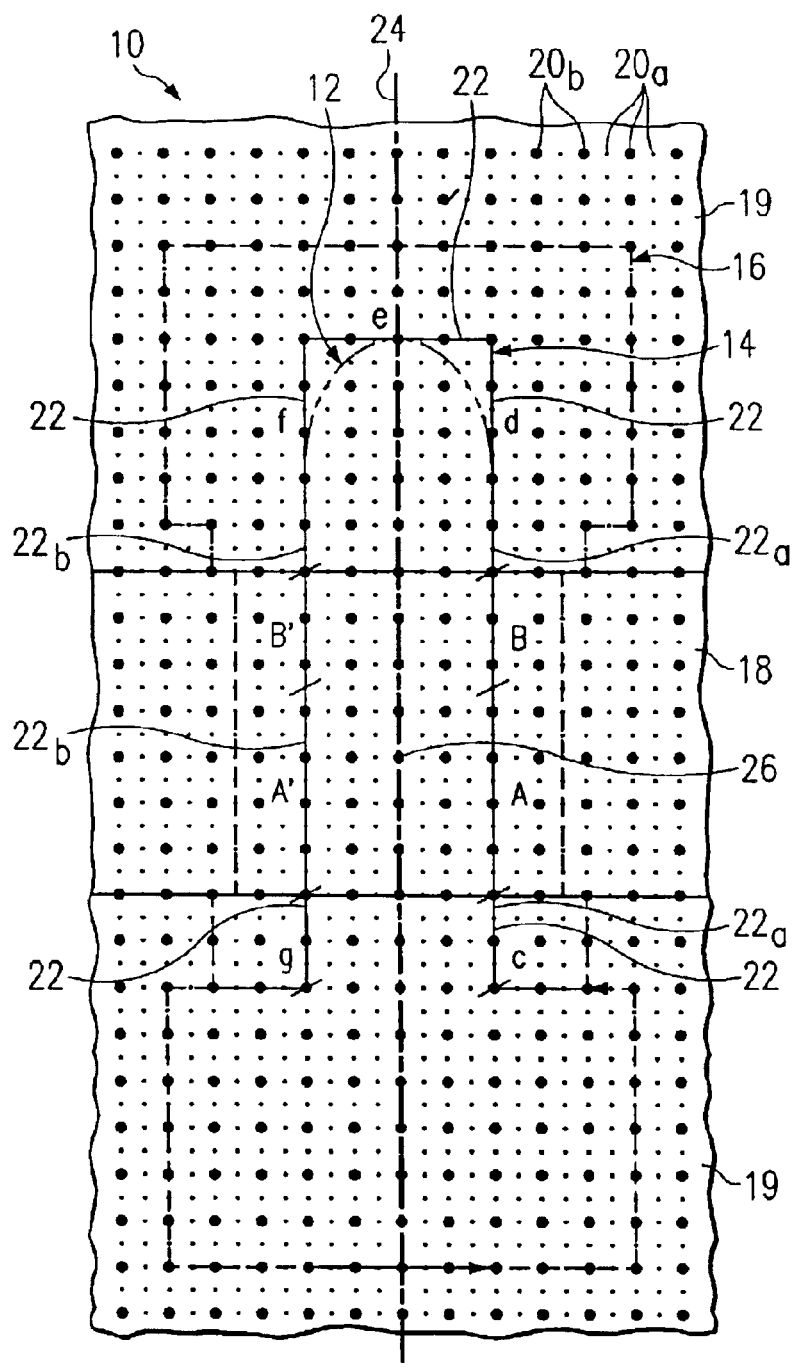
FIG. 1 is a diagram illustrating correction of a mask pattern according to one embodiment of the present invention.

FIG. 1 is a diagram 10 illustrating correction of a mask pattern according to one embodiment of the present invention. Diagram 10 illustrates the use of multiple grids that may be used to efficiently and effectively correct a mask pattern. The mask pattern may comprise, for example, all or a portion of any suitable photomask such as a binary mask, an attenuated mask, an alternating phase mask, or any other photomask suitable for defining a pattern on an integrated circuit. Fine grids may be used to perform more precise correction for certain regions of the mask pattern, while coarse grids may be used to perform more efficient correction of other regions. Any number of grids may be used to perform correction with appropriate accuracy and efficiency.

Diagram 10 includes a contour 12, an uncorrected pattern 14, and a corrected pattern 16. Uncorrected pattern 14 is corrected to yield corrected pattern 16 that defines contour 12 on an object. Contour 12 represents a desired pattern that a mask may define on an object such as an integrated circuit. For example, contour 12 may define a transistor gate of an integrated circuit with an active, or diffusion, region 18 and an inactive, or field, region 19. Active region 18 may be associated with critical dimensions. A critical dimension is a dimension that is required to be defined with a high degree of accuracy. For example, the channel length of the transistor gate at active region 18 may be defined as a critical dimension. The channel length may be required to be defined with an accuracy of, for example, approximately one nanometer. Regions associated with critical dimensions may require more precise correction than other regions.

Uncorrected pattern 14 represents a mask pattern for contour 12 that has not been corrected. Uncorrected pattern 14 may be corrected for deviations that may occur during the manufacturing process of an integrated circuit. For example, deviations may result from optical diffraction, etch effects, mask making errors, resist effects, or other effects occurring during the manufacturing process. To compensate for these deviations, uncorrected pattern 14 may be adjusted to yield corrected pattern 16.

In the illustrated example, uncorrected pattern 14 is divided into segments 22 designated segments A, A', B, B', c, d, e, f, and g. A correction for each segment 22 may be computed, and each segment 22 may be adjusted from uncorrected pattern 14 to corrected pattern 16. "Each" as used in this document means each member of a set or each member of a subset of the set. A correction may be calculated using, for example, optical proximity correction software such as TAURUS-OPC software by SYNOPSYS, INC. Corrections may be computed in a sequential manner around uncorrected pattern 14. For example, the following sequence may be used, segments c, A, B, d, e, f, B', A', and g.

In the illustrated example, capital letters represent segments 22 that define a critical dimension. The distance between segment A and segment A' and the distance between segment B and segment B' define the channel length of the transistor gate, which is a critical dimension.

A center line 24 may be used to control the correction of segments 22. Center line 24 may be defined substantially along an axis of symmetry of contour 12. During the correction process, some segments 22 may be moved towards one side and other segments may be moved towards another side, resulting in a jagged pattern. For example, segments A and A' may be moved towards the left, while segments B and B' may be moved towards the right. To control this movement, a center point 26 between segments 22 across center line 24 may be determined, and the segments 22 may be corrected such that center point 26 remains approximately at or near center line 24.

Diagram 10 includes abstract correction grids 20 that define possible positions of corrected pattern 16. An optimal position of segment 22 is calculated. If the optimal position does not lie on points of correction grid 20, segment 22 is moved, or snapped, to points of correction grid 20 proximate to the optimal position. Correction grids 20 may include, for example, a fine grid 20a and a coarse grid 20b. The intervals between points of fine grid 20a are smaller than the intervals between points of coarse grid 20b. For example, fine grid 20a may have intervals of one to two nanometers, and coarse grid 20b may have intervals of four to five nanometers. Any number of grids having any suitable intervals may be used to perform correction with the appropriate accuracy and efficiency.

Use of only coarse grid 20b to define corrected pattern 16 may result in a loss of accuracy, which may affect the formation of contour 12, particularly at segments 22 associated with critical dimensions. Use of only fine grid 20b, however, may yield a corrected pattern 16 having many vertices. A corrected pattern 16 with many vertices requires more processing time and storage capacity, thus decreasing efficiency of the correction process.

According to one embodiment, fine grid 20a is used to perform correction for segments 22 that require more precise correction, while coarse grid 20b is used to perform efficient correction of other segments 22. For example, correction of segments 22 of active region 18 having a critical dimension is defined by fine grid 20a, and correction of segments 22 of inactive region 19 is defined by coarse grid 20b. In the illustrated example, segments A, A', B, and B' of active region 18 are snapped to fine grid 20a, while segments c, d, e, f, and g of inactive region 19 are snapped to coarse grid 20b.

Figure 2:
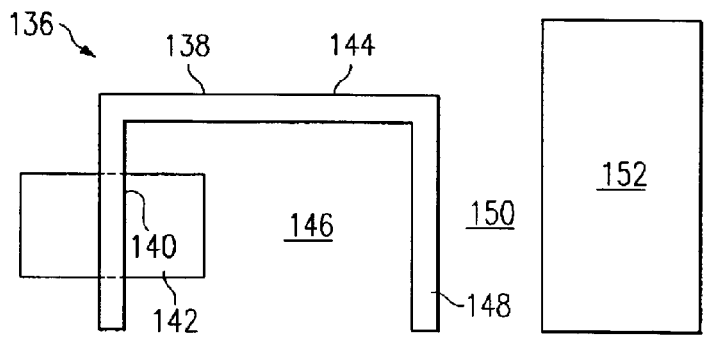
FIG. 2 is a diagram illustrating snapping segments to correction grids.

FIG. 2 is a diagram 136 illustrating snapping segments to correction grids. Diagram 136 includes an uncorrected pattern 138. Uncorrected pattern 138 has segments 140 that have critical dimensions. Segments 140 require precise correction and are associated with a fine grid 142. Other segments 144 that do not require precise correction are associated with a coarse grid 146. Uncorrected pattern 138 includes a line region 148 that is proximate to a correctable region 152 such as a polysilicon region. Line region 148 has a length and width. A space region 150 is located between line region 148 and correctable region 152.

An optimal position of a segment is calculated, and the segment is snapped to points of a correction grid proximate to the optimal position. The selection of points to which the segment is snapped may be made according to any suitable procedure. A segment may be snapped to points that are closest to the optimal position. For example, a segment 140 may be snapped to points of fine grid 142 that are closest to the optimal position for segment 140.

Alternatively, a segment may be snapped to increase the size of a space region. For example, segments 144 may be snapped to points that increase the size of space region 150 between line region 148 and correctable region 152.

Alternatively, a segment may snapped to increase the width of a line region. For example, segments 144 may be snapped to points that increase the width of line region 148.

The snapping procedure may be associated with the type of correction grid 20. For example, snapping the segment to the closest points may be used for segments 140 associated with fine grid 142, and other procedures may be used for segments 144 associated with coarse grid 146. Snapping procedures may also be prioritized. For example, a snapping procedure that increases the size of space region 150 may take priority over a snapping procedure that increases the width of line region 148.

Figure 3:
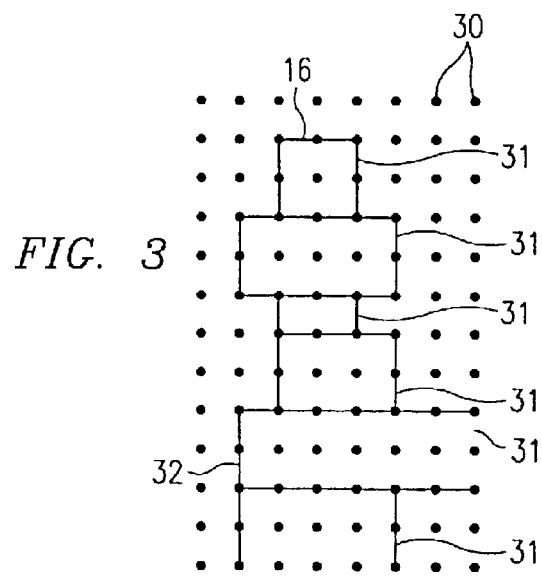
FIG. 3 illustrates a fracture grid that may be used to form a mask from a corrected pattern according to one embodiment of the present invention.

FIG. 3 illustrates a fracture grid 30 that may be used to form a mask from corrected pattern 16 according to one embodiment of the present invention. Corrected pattern 16 is fractured into rectangles 31 defined by fracture grid 30 to generate a fracture pattern 32. Fracture pattern 32 is used to form the mask. A corrected pattern 16 with more vertices typically requires more rectangles 31, and thus requires more time to fracture. Moreover, in general, more time is needed to form a mask from a fracture pattern 32 having more rectangles. Accordingly, using coarse grid 20b for regions that do not require precise correction may provide for more efficient mask formation.

To allow for efficient placement of corrected pattern 16 on fracture grid 30, fracture grid 30 may have points at intervals that can accommodate the points of correction grids 20. The intervals of fracture grid may be the greatest common divisor of the intervals of correction grids 20. For example, if fine grid 20a has intervals of two nanometers, and coarse grid 20b has intervals of five nanometers, fracture grid 30 may be defined by intervals of one nanometer.

Figure 4:
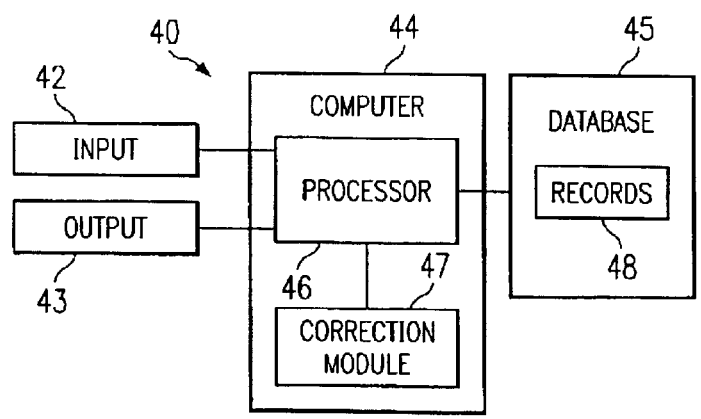
FIG. 4 illustrates a system for correcting a mask pattern.

FIG. 4 illustrates a system 40 for correcting a mask pattern. System 40 includes an input device 42 and an output device 43 coupled to a computer 44, which is in turn coupled to a database 45. Input device 42 may comprise, for example, a keyboard, a mouse, or any other device suitable for transmitting data to computer 44. Output device 43 may comprise, for example, a display, a printer, or any other device suitable for reporting data received from computer 44.

Computer 44 may comprise a personal computer, workstation, network computer, wireless computer, or one or more microprocessors within these or other devices, or any other suitable processing device. Computer 44 may include a processor 46 and a correction module 47. Processor 46 controls the flow of data between input device 42, output device 43, database 45, and correction module 47. Correction module 47 receives descriptions of contour 12 and uncorrected pattern 14, and computes corrected pattern 16 used to form a mask pattern.

Database 45 may comprise any suitable system for storing data. Database 45 stores records 48 that include data associated with contour 12, uncorrected pattern 14, and corrected pattern 16. A record 48 may be associated with a segment 22. Record 48 may describe a segment type of segment 22, and a correction grid 20 such as fine grid 20a or coarse grid 20b associated with segment 22.

Figure 5:
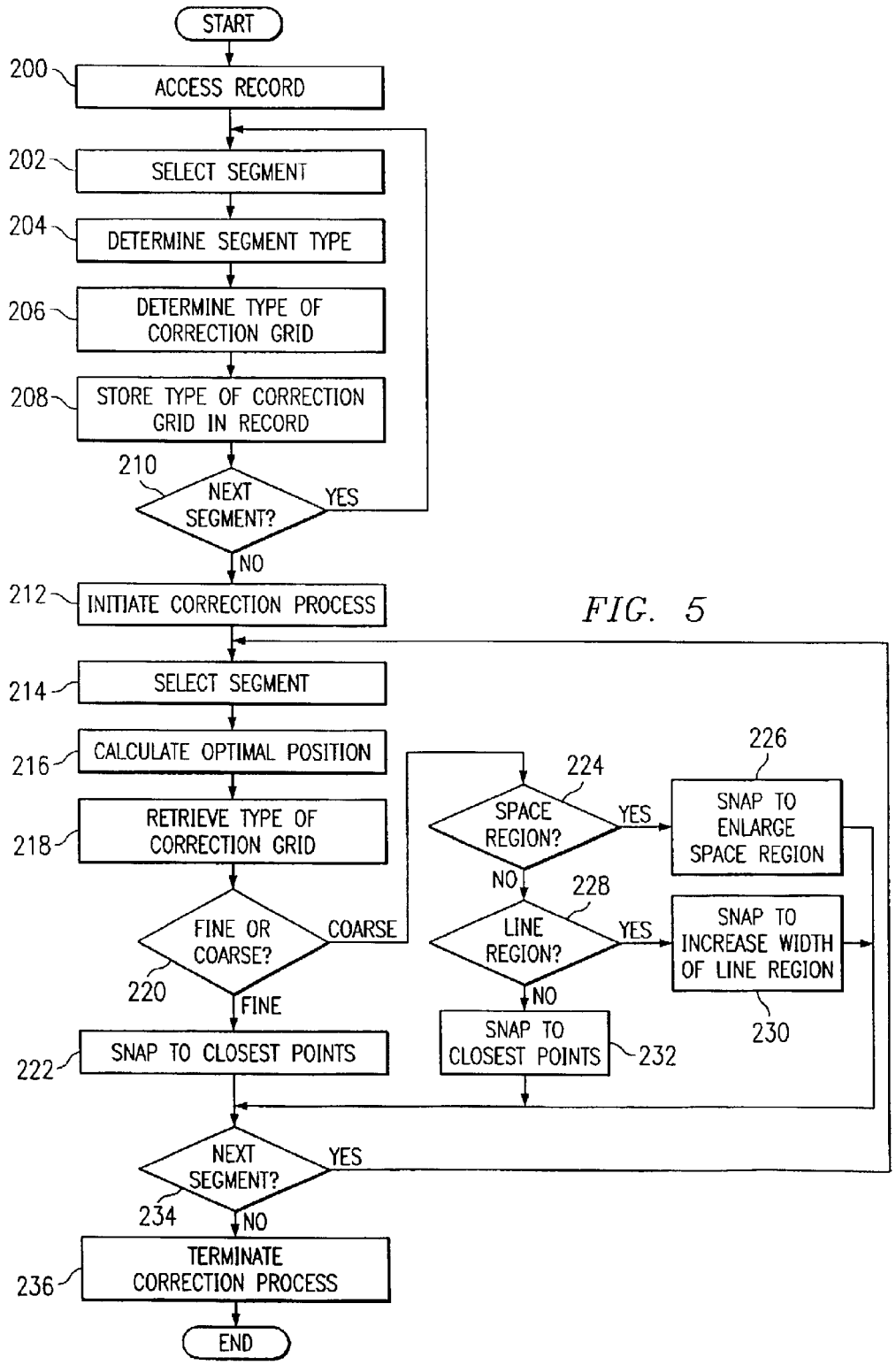
FIG. 5 is a flowchart illustrating one embodiment of a method for correcting a mask pattern.

FIG. 5 is a flowchart illustrating one embodiment of a method for correcting a mask pattern. The method begins at step 200, where records 48 that describe segments 22 are accessed. A segment 22 is selected at step 202. A segment type associated with segment 22 is determined from records 48 at step 204. A segment type refers to a segment that has a set of distinguishing characteristics or that is selected for particular treatment. A segment type may include, for example, an active diffusion region segment or an inactive field region segment. The type of correction grid 20 associated with the segment type is determined at step 206. Correction grid types may include, for example, fine grid 20*a* and coarse grid 20*b*. The type of correction grid 20 associated with segment 22 is stored in record 48 for segment 22 at step 208.

If there is a next segment 22 at step 210, the method returns to step 202 to select the next segment 22. If there is no next segment 22 at step 210, the method proceeds to 212, where correction module 47 initiates the correction process. A segment 22 to be corrected is selected at step 214. The optimal position for segment 22 is calculated at step 216. The correction may be calculated using optical proximity correction software such as TAURUS-OPC software by SYNOPSYS, INC.

The type of correction grid 20 associated with the selected 22 is retrieved from record 48 at step 218. Segment 22 may be associated with fine grid 20*a* or coarse grid 20*b*. If segment 22 is associated with fine grid 20*a* at step 220, the method proceeds to 222, where segment 22 is snapped to the closest points of fine grid 20*a*. If segment 22 is associated with coarse grid 20*b* at step 220, the method proceeds to step 224. At step 224, correction module 47 determines whether segment 22 defines a space region 150 in whole or in part. If segment 22 defines a space region 150, the method proceeds to step 226, where segment 22 is snapped to the points that increase the size of space region 150. If segment 22 does not define a space region 150 at step 224, the method proceeds to step 228.

At step 228, correction module determines whether segment 22 defines a line region 148 in whole or in part. If segment 22 defines a line region 148, the method proceeds to step 230, where segment 22 is snapped to points that increase the width of line region 148. If segment 22 does not define a line region 150 at step 228, the method proceeds to step 232. At step 232, segment 22 is snapped to the closest points, and the method proceeds to step 234. If there is a next segment at step 234, the method proceeds to step 214 to select the next segment. If there is no next segment, the method proceeds to step 236, where correction module 47 terminates the correction process. After terminating the correction process, the method terminates.

While the examples given have been with respect to patterning transistor gates over diffusion regions, the methods and systems described herein may also be used to correct patterns of other layers of integrated circuits. For example, the methods and systems may be used to perform correction of interconnect layers with respect to associated contact or via layers, or may be used to perform correction of corner or bend features in interconnect layers.

Although an embodiment of the invention and its advantages are described in detail, a person skilled in the art could make various alterations, additions, and omissions without departing from the spirit and scope of the present invention as defined by the appended claims.

What is claimed is:

1. A method for correcting a mask pattern, comprising:
   accessing a record associated with an uncorrected pattern, the uncorrected pattern comprising a plurality of segments, the record associating each segment with a correction grid of a plurality of correction grids comprising a fine grid and a coarse grid, each correction grid comprising a plurality of points;
   selecting a segment;
   determining an optimal correction for the segment;
   determining a correction grid associated with the segment; and
   snapping the segment to a subset of points of the associated correction grid, the subset of points proximate to the optimal correction, to form a corrected pattern of a mask pattern.

2. The method of claim 1, further comprising repeating the following for each segment of the plurality of segments:
   selecting a segment;
   determining an optimal correction for the segment;
   determining a correction grid associated with the segment; and
   snapping the segment to a subset of points of the associated correction grid, the subset of points proximate to the optimal correction, to form a corrected pattern of a mask pattern.

3. The method of claim 1, wherein the plurality of correction grids comprises a fine grid and a coarse grid, the fine grid associated with a more precise correction, and the coarse grid associated with a less precise correction.

4. The method of claim 1, wherein:
   the plurality of correction grids comprises a fine grid and a coarse grid, the fine grid associated with a more precise correction, and the coarse grid associated with a less precise correction; and
   the corrected pattern is associated with a fracture grid having an interval that is a greatest common divisor of an interval of the fine grid and an interval of the coarse grid.

5. The method of claim 1, wherein snapping the segment to a subset of points of the correction grid comprises snapping the segment to a subset of points nearest to the optimal correction.

6. The method of claim 1, wherein snapping the segment to a subset of points of the correction grid comprises snapping the segment to a subset of points that enlarges a space region defined by the segment.

7. The method of claim 1, wherein snapping the segment to a subset of points of the correction grid comprises snapping the segment to a subset of points that widens a line region defined by the segment.

8. The method of claim 1, wherein snapping the segment to a subset of points of the correction grid comprises:
   snapping the segment to a subset of points that enlarges a space region, if the segment defines the space region;
   snapping the segment to a subset of points that widens a line region, if the segment defines the line region; and
   snapping the segment to a subset of points nearest to the optimal correction, if otherwise.

9. The method of claim 1, wherein snapping the segment to a subset of points of the correction grid comprises:
   if the segment is associated with a fine grid of the plurality of correction grids, snapping the segment to a subset of points nearest to the optimal correction; and
   if the segment is associated with a coarse grid of the plurality of correction grids:
      snapping the segment to a subset of points that enlarges a space region if the segment defines the space region;
      snapping the segment to a subset of points that widens a line region if the segment defines the line region; and
      snapping the segment to a subset of points nearest to the optimal correction if otherwise.

10. A system for correcting a mask pattern, comprising:

a database operable to store a record associated with an uncorrected pattern, the uncorrected pattern comprising a plurality of segments, the record associating each segment with a correction grid of a plurality of correction grids comprising a fine grid and a coarse grid, each correction grid comprising a plurality of points; and a correction module coupled to the database and operable to:

select a segment;

determine an optimal correction for the segment;

determine a correction grid associated with the segment; and snap the segment to a subset of points of the associated correction grid, the subset of points proximate to the optimal correction, to form a corrected pattern of a mask pattern.

11. The system of claim 10, the correction module further operable to repeat the following for each segment of the plurality of segments:

selecting a segment;

determining an optimal correction for the segment;

determining a correction grid associated with the segment; and snapping the segment to a subset of points of the associated correction grid, the subset of points proximate to the optimal correction, to form a corrected pattern of a mask pattern.

12. The system of claim 10, wherein the plurality of correction grids comprises a fine grid and a coarse grid, the fine grid associated with a more precise correction, and the coarse grid associated with a less precise correction.

13. The system of claim 10, wherein:

the plurality of correction grids comprises a fine grid and a coarse grid, the fine grid associated with a more precise correction, and the coarse grid associated with a less precise correction; and the corrected pattern is associated with a fracture grid having an interval that is a greatest common divisor of an interval of the fine grid and an interval of the coarse grid.

14. The system of claim 10, wherein the correction module is operable to snap the segment to a subset of points of the correction grid by snapping the segment to a subset of points nearest to the optimal correction.

15. The system of claim 10, wherein the correction module is operable to snap the segment to a subset of points of the correction grid by snapping the segment to a subset of points that enlarges a space region defined by the segment.

16. The system of claim 10, wherein the correction module is operable to snap the segment to a subset of points of the correction grid by snapping the segment to a subset of points that widens a line region defined by the segment.

17. The system of claim 10, wherein the correction module is operable to snap the segment to a subset of points of the correction grid by:

snapping the segment to a subset of points that enlarges a space region, if the segment defines the space region;

snapping the segment to a subset of points that widens a line region, if the segment defines the line region; and snapping the segment to a subset of points nearest to the optimal correction, if otherwise.

18. The system of claim 10, wherein the correction module is operable to snap the segment to a subset of points of the correction grid by:

if the segment is associated with a fine grid of the plurality of correction grids, snapping the segment to a subset of points nearest to the optimal correction; and if the segment is associated with a coarse grid of the plurality of correction grids:

snapping the segment to a subset of points that enlarges a space region if the segment defines the space region;

snapping the segment to a subset of points that widens a line region if the segment defines the line region; and snapping the segment to a subset of points nearest to the optimal correction if otherwise.

19. A system for correcting a mask pattern, comprising:

means for accessing a record associated with an uncorrected pattern, the uncorrected pattern comprising a plurality of segments, the record associating each segment with a correction grid of a plurality of correction grids comprising a fine grid and a coarse grid, each correction grid comprising a plurality of points;

means for selecting a segment;

means for determining an optimal correction for the segment;

means for determining a correction grid associated with the segment; and means for snapping the segment to a subset of points of the associated correction grid, the subset of points proximate to the optimal correction, to form a corrected pattern of a mask pattern.

20. A method for correcting a mask pattern, comprising:

accessing a record associated with an uncorrected pattern, the uncorrected pattern comprising a plurality of segments, the record associating each segment with a correction grid of a plurality of correction grids, each correction grid comprising a plurality of points, the plurality of correction grids comprising a fine grid and a coarse grid, the fine grid associated with a more precise correction, the coarse grid associated with a less precise correction, the corrected pattern associated with a fracture grid having an interval that is a greatest common divisor of an interval of the fine grid and an interval of the coarse grid;

repeating the following for each segment of the plurality of segments:

selecting a segment;

determining an optimal correction for the segment;

determining a correction grid associated with the segment; and snapping the segment to a subset of points of the associated correction grid, the subset of points proximate to the optimal correction, to form a corrected pattern of a mask pattern by:

if the segment is associated with the fine grid, snapping the segment to a subset of points nearest to the optimal correction; and if the segment is associated with the coarse grid:

snapping the segment to a subset of points that enlarges a space region if the segment defines the space region, snapping the segment to a subset of points that widens a line region if the segment defines the line region, and snapping the segment to a subset of points nearest to the optimal correction otherwise.

* * * * *